(12) United States Patent
Takeda et al.

(10) Patent No.: US 9,209,591 B2
(45) Date of Patent: Dec. 8, 2015

(54) LASER PROCESSING METHOD

(71) Applicant: DISCO CORPORATION, Tokyo (JP)

(72) Inventors: Noboru Takeda, Tokyo (JP); Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 38 days.

(21) Appl. No.: 14/276,571

(22) Filed: May 13, 2014

(65) Prior Publication Data

US 2014/0334511 A1    Nov. 13, 2014

(30) Foreign Application Priority Data

May 13, 2013   (JP) ................................ 2013-101557

(51) Int. Cl.

| | |
|---|---|
| *H01L 21/00* | (2006.01) |
| *H01S 3/10* | (2006.01) |
| *H01L 23/00* | (2006.01) |
| *H01S 5/02* | (2006.01) |
| *H01S 5/323* | (2006.01) |

(52) U.S. Cl.
CPC . *H01S 3/10* (2013.01); *H01L 21/00* (2013.01); *H01L 23/00* (2013.01); *H01S 5/0201* (2013.01); *H01S 5/32341* (2013.01); *H01S 5/021* (2013.01); *H01S 5/0213* (2013.01)

(58) Field of Classification Search
CPC .................................. H01S 3/10; H01S 5/0213
USPC ........................................................... 438/463
See application file for complete search history.

(56) References Cited

FOREIGN PATENT DOCUMENTS

| | | | |
|---|---|---|---|
| JP | 10-305420 | 11/1998 | |
| JP | 2002-192370 | * 7/2002 | ............. B23K 26/00 |

* cited by examiner

*Primary Examiner* — Tuan Nguyen
(74) *Attorney, Agent, or Firm* — Greer Burns & Crain Ltd.

(57) ABSTRACT

A laser processing method of applying a pulsed laser beam to a single crystal substrate to thereby process the single crystal substrate. The laser processing method includes a numerical aperture setting step of setting the numerical aperture (NA) of a focusing lens for focusing the pulsed laser beam so that the value obtained by dividing the numerical aperture (NA) of the focusing lens by the refractive index (N) of the single crystal substrate falls within the range of 0.05 to 0.2, a positioning step of relatively positioning the focusing lens and the single crystal substrate in the direction along the optical axis of the focusing lens so that the focal point of the pulsed laser beam is set at a desired position in the direction along the thickness of the single crystal substrate, and a shield tunnel forming step of applying the pulsed laser beam to the single crystal substrate so as to focus the pulsed laser beam at the focal point set in the single crystal substrate thereby forming a shield tunnel extending between the focal point and a beam incident surface to which the pulsed laser beam is applied.

9 Claims, 8 Drawing Sheets

LASER PROCESSING METHOD

BACKGROUND OF THE INVENTION

1. Field of the Invention

The present invention relates to a laser processing method of performing laser processing to a single crystal substrate such as a silicon (Si) substrate, sapphire ($Al_2O_3$) substrate, silicon carbide (SiC) substrate, and gallium nitride (GaN) substrate.

2. Description of the Related Art

As well known in the art, in a semiconductor device fabrication process, a functional layer is composed of an insulating film and a functional film is formed on the front side of a silicon (Si) substrate, and a plurality of semiconductor devices such as ICs and LSIs are formed like a matrix from this functional layer, thus obtaining a semiconductor wafer having the plural semiconductor devices. The plural semiconductor devices are partitioned by a plurality of crossing division lines formed on the front side of the semiconductor wafer. The semiconductor wafer is divided along these division lines to obtain the individual semiconductor devices as chips.

Further, in an optical device fabrication process, an optical device wafer is provided by forming an optical device layer composed of an n-type nitride semiconductor layer and a p-type nitride semiconductor layer on the front side of a sapphire ($Al_2O_3$) substrate, silicon carbide (SiC) substrate, or gallium nitride (GaN) substrate. The optical device layer is partitioned by a plurality of crossing division lines to define a plurality of regions where a plurality of optical devices such as light emitting diodes and laser diodes are respectively formed. The optical device wafer is cut along the division lines to thereby divide the regions where the optical devices are formed from each other, thus obtaining the individual optical devices as chips.

As a method of dividing a wafer such as a semiconductor wafer and an optical device wafer along the division lines, there has been tried a laser processing method of applying a pulsed laser beam having a transmission wavelength to the wafer along the division lines in the condition where the focal point of the pulsed laser beam is set inside the wafer in a subject area to be divided. More specifically, this wafer dividing method using laser processing includes the steps of applying a pulsed laser beam having a transmission wavelength to the wafer from one side of the wafer along the division lines in the condition where the focal point of the pulsed laser beam is set inside the wafer to thereby continuously form a modified layer inside the wafer along each division line and next applying an external force to the wafer along each division line where the modified layer is formed to be reduced in strength, thereby dividing the wafer into the individual devices (see Japanese Patent No. 3408805, for example).

As another method of dividing a wafer such as a semiconductor wafer and an optical device wafer along the division lines, there has been put into practical use a technique including the steps of applying a pulsed laser beam having an absorption wavelength to the wafer along the division lines to thereby form a laser processed groove along each division line by ablation and next applying an external force to the wafer along each division line where the laser processed groove is formed as a break start point, thereby breaking the wafer along each division line (see Japanese Patent Laid-open No. Hei 10-305420, for example).

SUMMARY OF THE INVENTION

In forming a modified layer inside a wafer in the condition where the focal point of a laser beam is set inside the wafer, it is necessary to use a focusing lens having a numerical aperture (NA) of about 0.8. Accordingly, to divide a wafer having a thickness of 300 µm, for example, into individual devices, a plurality of modified layers stacked must be formed along each division line, causing a reduction in productivity.

Further, in the case of applying a pulsed laser beam having an absorption wavelength to a wafer, ablation occurs near the surface of the wafer irradiated with the pulsed laser beam, so that the energy of the pulsed laser beam does not penetrate into the inside of the wafer. Accordingly, the pulsed laser beam must be applied plural times along each division line, causing a reduction in productivity. In addition, debris may scatter in performing the ablation to cause a degradation in quality of each chip.

It is therefore an object of the present invention to provide a laser processing method which can efficiently divide a single crystal substrate into individual chips along division lines and can also prevent a degradation in quality of each chip.

In accordance with an aspect of the present invention, there is provided a laser processing method of applying a pulsed laser beam to a single crystal substrate to thereby process the single crystal substrate, the laser processing method including: a numerical aperture setting step of setting the numerical aperture (NA) of a focusing lens for focusing the pulsed laser beam so that the value obtained by dividing the numerical aperture (NA) of the focusing lens by the refractive index (N) of the single crystal substrate falls within the range of 0.05 to 0.2; a positioning step of relatively positioning the focusing lens and the single crystal substrate in the direction along the optical axis of the focusing lens so that the focal point of the pulsed laser beam is set at a desired position in the direction along the thickness of the single crystal substrate; and a shield tunnel forming step of applying the pulsed laser beam to the single crystal substrate so as to focus the pulsed laser beam at the focal point set in the single crystal substrate by the positioning step, thereby forming a shield tunnel extending between the focal point and a beam incident surface to which the pulsed laser beam is applied, the shield tunnel being composed of a fine hole and an amorphous region formed around the fine hole for shielding the fine hole.

Preferably, the positioning step includes the step of setting the focal point of the pulsed laser beam inside the single crystal substrate at a position near the other surface opposite to the beam incident surface.

Preferably, the shield tunnel forming step includes the step of forming a plurality of shield tunnels along a division line set on the single crystal substrate, each shield tunnel being composed of the fine hole and the amorphous region. In this mode, the amorphous regions of any adjacent ones of the plural shield tunnels are connected with each other.

Preferably, the energy of the pulsed laser beam is set so that the length of the shield tunnel is equal to the thickness of the single crystal substrate.

Preferably, the correlation between the energy of the pulsed laser beam and the length of the shield tunnel is produced and the energy of the pulsed laser beam corresponding to the length of the shield tunnel desired to be formed is set according to the correlation. In this mode, the energy of the pulsed laser beam is 5 µJ/pulse or more and the correlation is expressed as $Y=(3.0$ to $4.0$ µm/µJ$)X+50$ µm, where X and Y denote the energy (µJ/pulse) of the pulsed laser beam and the length (µm) of the shield tunnel, respectively.

Preferably, the wavelength of the pulsed laser beam is set to a value two or more times the wavelength corresponding to a band gap of the single crystal substrate.

Preferably, the numerical aperture setting step includes the step of setting the numerical aperture (NA) of the focusing lens to 0.1 to 0.35 in the case that the single crystal substrate is a sapphire ($Al_2O_3$) substrate, setting the numerical aperture (NA) of the focusing lens to 0.15 to 0.55 in the case that the single crystal substrate is a silicon carbide (SiC) substrate, or setting the numerical aperture (NA) of the focusing lens to 0.1 to 0.5 in the case that the single crystal substrate is a gallium nitride (GaN) substrate.

In the laser processing method according to the present invention, the numerical aperture (NA) of the focusing lens for focusing the pulsed laser beam is set so that the value obtained by dividing the numerical aperture (NA) of the focusing lens by the refractive index (N) of the single crystal substrate falls within the range of 0.05 to 0.2. Thereafter, the pulsed laser beam is applied to the single crystal substrate so as to be focused at the focal point set in the single crystal substrate, thereby forming a shield tunnel extending between the focal point and a beam incident surface to which the pulsed laser beam is applied, the shield tunnel being composed of a fine hole and an amorphous region formed around the fine hole for shielding the fine hole. Accordingly, even when the single crystal substrate has a thickness of 300 µm, for example, the shield tunnel can be formed so as to extend from the beam incident surface (upper surface) to the lower surface of the single crystal substrate. That is, even when the thickness of the single crystal substrate is large, it is sufficient to once apply the pulsed laser beam along each division line, so that the productivity can be greatly improved. Furthermore, no debris is scattered in the shield tunnel forming step, so that it is possible to solve the problem that the devices may be degraded in quality.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
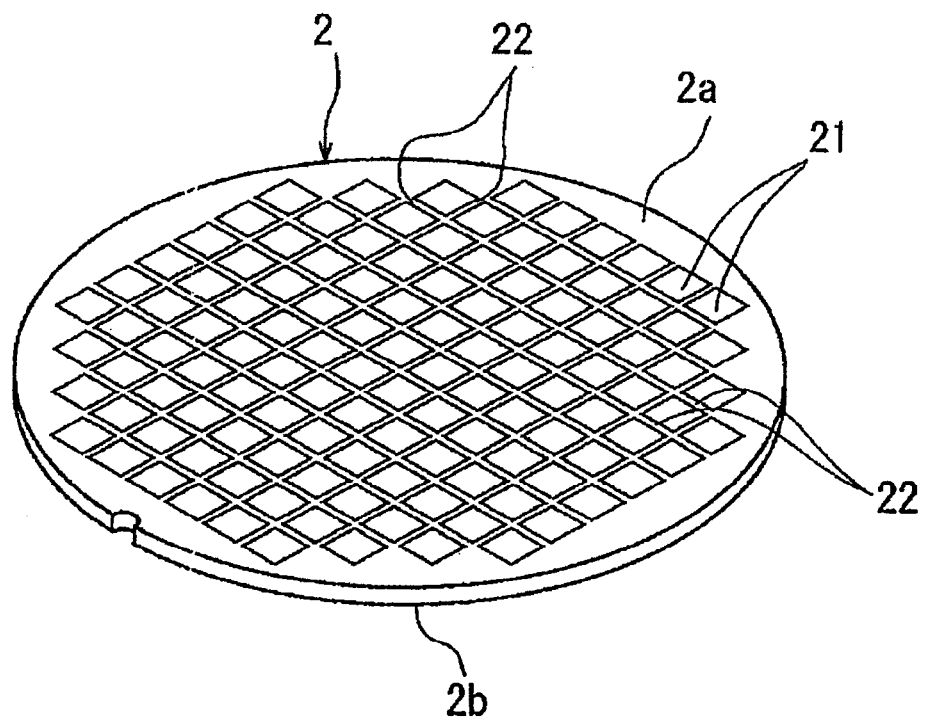
FIG. 1 is a perspective view of an optical device wafer as a single crystal substrate to be processed.

The laser processing method according to the present invention will now be described in more detail with reference to the attached drawings. FIG. 1 is a perspective view of an optical device wafer 2 as a single crystal substrate to be processed by the laser processing method according to the present invention. The optical device wafer 2 shown in FIG. 1 is composed of a sapphire substrate having a thickness of 300 µm, for example, and a plurality of optical devices 21 such as light emitting diodes and laser diodes formed on the front side 2a of the sapphire substrate so as to be arranged like a matrix. These optical devices 21 are partitioned by a plurality of crossing division lines 22 formed on the front side 2a of the sapphire substrate, i.e., on the front side of the optical device wafer 2.

Figure 2:
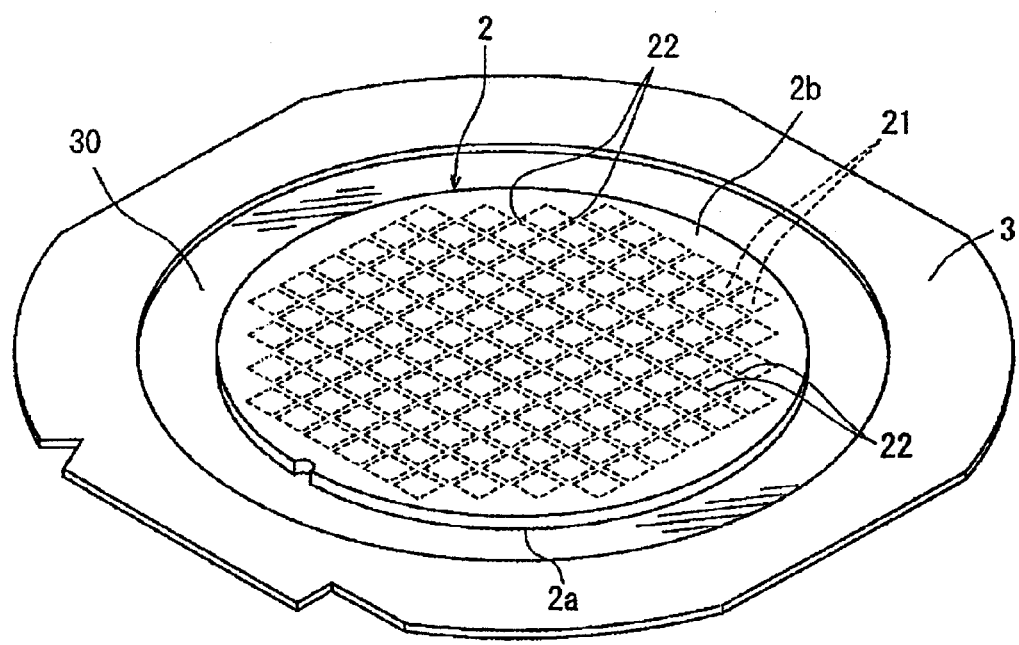
FIG. 2 is a perspective view showing a condition that the optical device wafer shown in FIG. 1 is attached to a dicing tape supported to an annular frame.

There will now be described a laser processing method of performing laser processing to the optical device wafer 2 along the division lines 22 to divide the wafer 2 along the division lines 22. First, a wafer supporting step is performed in such a manner that the optical device wafer 2 is attached to a dicing tape supported to an annular frame. More specifically, as shown in FIG. 2, a dicing tape 30 is supported at its peripheral portion to an annular frame 3 so as to close the inner opening of the annular frame 3, and the front side 2a of the optical device wafer 2 is attached to the dicing tape 30 supported to the annular frame 3. Accordingly, the back side 2b of the optical device wafer 2 attached to the dicing tape 30 is oriented upward.

Figure 3:
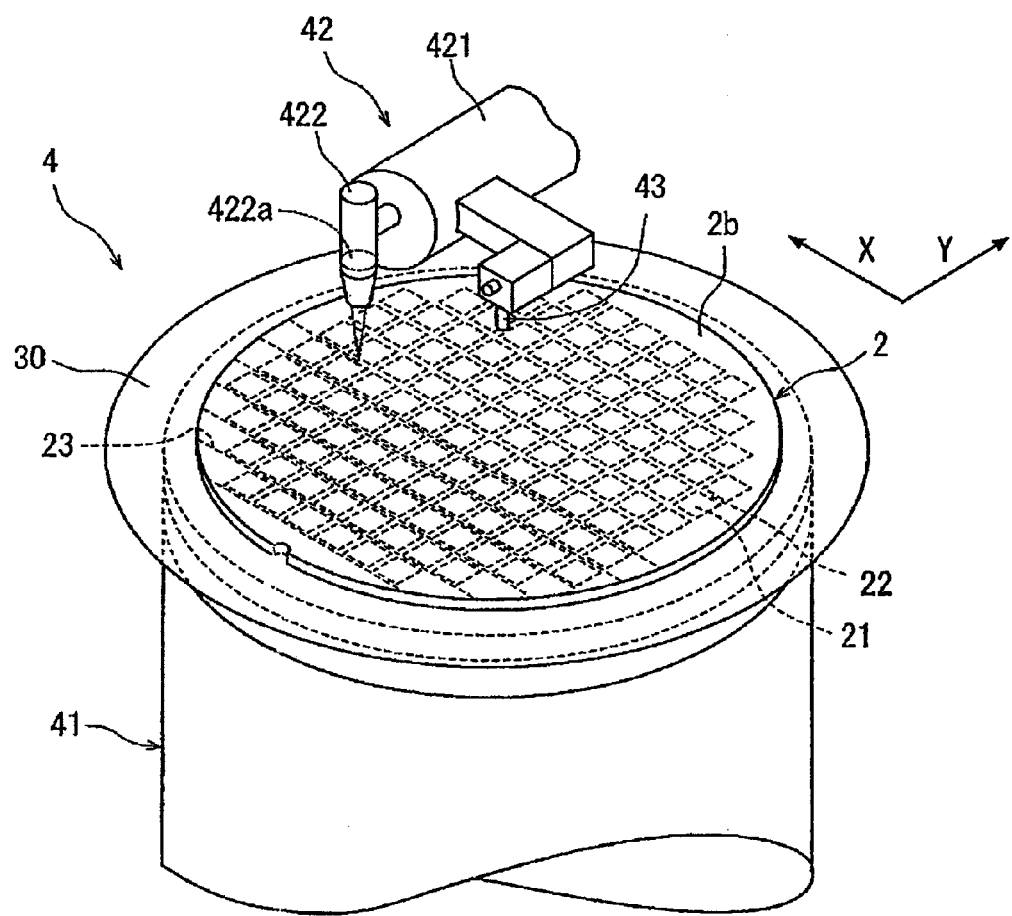
FIG. 3 is a perspective view of an essential part of a laser processing apparatus for performing a shield tunnel forming step.

FIG. 3 shows an essential part of a laser processing apparatus 4 for performing the laser processing along the division lines 22 on the optical device wafer 2 after performing the wafer supporting step mentioned above. As shown in FIG. 3, the laser processing apparatus 4 includes a chuck table 41 for holding a workpiece, laser beam applying means 42 for applying a laser beam to the workpiece held on the chuck table 41, and imaging means 43 for imaging the workpiece held on the chuck table 41. The chuck table 41 has an upper surface as a holding surface for holding the workpiece thereon under suction. The chuck table 41 is movable both in the feeding direction shown by an arrow X in FIG. 3 by feeding means (not shown) and in the indexing direction shown by an arrow Y in FIG. 3 by indexing means (not shown).

The laser beam applying means 42 includes a cylindrical casing 421 extending in a substantially horizontal direction. Although not shown, the casing 421 contains pulsed laser beam oscillating means including a pulsed laser beam oscillator and repetition frequency setting means. The laser beam applying means 42 further includes focusing means 422 mounted on the front end of the casing 421. The focusing means 422 has a focusing lens 422a for focusing a pulsed laser beam oscillated by the pulsed laser beam oscillating means. The numerical aperture (NA) of the focusing lens 422a of the focusing means 422 is set in the following manner. That is, the numerical aperture (NA) of the focusing lens 422a is set so that the value obtained by dividing the numerical aperture (NA) of the focusing lens 422a by the refractive index (N) of the single crystal substrate falls with the range of 0.05 to 0.2 (numerical aperture setting step). The laser beam applying means 42 further includes focal position adjusting means (not shown) for adjusting the focal position of the pulsed laser beam to be focused by the focusing lens 422a of the focusing means 422.

The imaging means 43 is mounted on a front end portion of the casing 421 constituting the laser beam applying means 42. The imaging means 43 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 43 is transmitted to control means (not shown).

In performing the laser processing along the division lines 22 on the optical device wafer 2 by using the laser processing apparatus 4 after the wafer supporting step, a positioning step is performed in such a manner that the focusing lens and the single crystal substrate are relatively positioned in the direction along the optical axis of the focusing lens so that the focal point of the pulsed laser beam is set at a desired position in the direction along the thickness of the optical device wafer 2 as the single crystal substrate.

First, the optical device wafer 2 attached to the dicing tape 30 is placed on the chuck table 41 of the laser processing apparatus 4 shown in FIG. 3 in the condition where the dicing tape 30 is in contact with the upper surface of the chuck table 41. Thereafter, suction means (not shown) is operated to hold the optical device wafer 2 through the dicing tape 30 on the chuck table 41 under suction (wafer holding step). Accordingly, the back side 2b of the optical device wafer 2 held on the chuck table 41 is oriented upward. Although the annular frame 3 supporting the dicing tape 30 is not shown in FIG. 3, the annular frame 3 is held by any suitable frame holding means provided on the chuck table 41. Thereafter, the chuck table 41 holding the optical device wafer 2 is moved to a position directly below the imaging means 43 by operating the feeding means (not shown).

In the condition where the chuck table 41 is positioned directly below the imaging means 43, an alignment operation is performed by the imaging means 43 and the control means (not shown) to detect a subject area of the optical device wafer 2 to be laser-processed. More specifically, the imaging means 43 and the control means perform image processing such as pattern matching for making the alignment of the division lines 22 extending in a first direction on the optical device wafer 2 and the focusing means 422 of the laser beam applying means 42 for applying the laser beam to the wafer 2 along the division lines 22, thus performing the alignment of a laser beam applying position (alignment step). Similarly, this alignment step is performed for the other division lines 22 extending in a second direction perpendicular to the first direction on the optical device wafer 2. Although the front side 2a of the optical device wafer 2 on which the division lines 22 are formed is oriented downward, the division lines 22 can be imaged through the wafer 2 from the back side 2b thereof because the imaging means 43 includes the infrared light applying means for applying infrared light to the wafer 2, the optical system for capturing the infrared light applied to the wafer 2, and the imaging device (infrared CCD) for outputting an electrical signal corresponding to the infrared light captured by the optical system as described above.

Figure 4A:
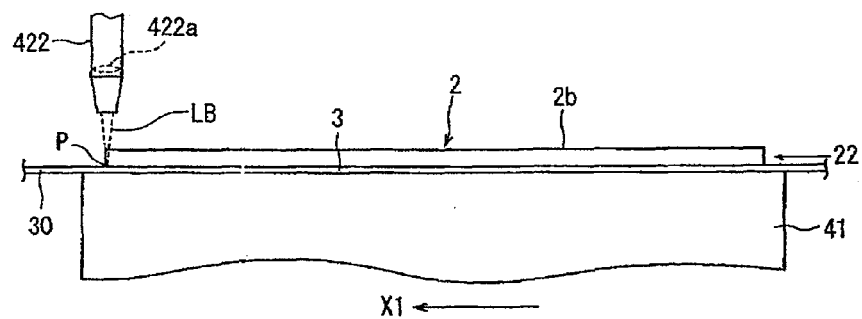
FIGS. 4A to 4E are views for illustrating the shield tunnel forming step.

After performing the alignment step mentioned above for all of the division lines 22, the chuck table 41 is moved to a laser beam applying area where the focusing means 422 of the laser beam applying means 42 is located as shown in FIG. 4A, thereby positioning one end (left end as viewed in FIG. 4A) of a predetermined one of the division lines 22 extending in the first direction directly below the focusing means 422. Further, the focal position adjusting means (not shown) is operated to move the focusing means 422 in the direction along the optical axis of the focusing lens 422a so that the focal point P of a pulsed laser beam LB to be focused by the focusing lens 422a is set at a desired position in the direction along the thickness of the optical device wafer 2 as the single crystal substrate (positioning step). In this preferred embodiment, the focal point P of the pulsed laser beam LB is set inside the optical device wafer 2 at a position near the lower surface (front side 2a) opposite to the upper surface (back side 2b) as the beam incident surface to which the pulsed laser beam LB is applied.

Figure 4B:
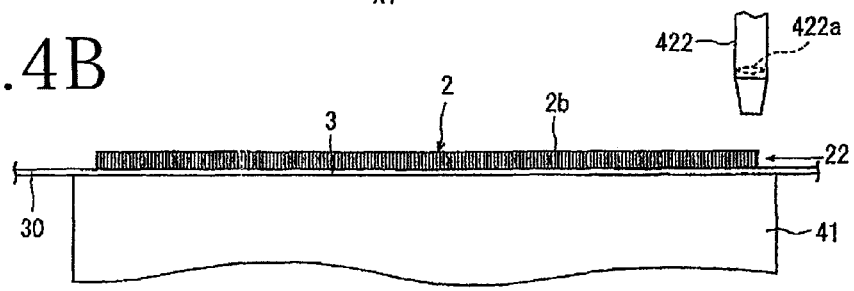

After performing the positioning step mentioned above, a shield tunnel forming step is performed in such a manner that the laser beam applying means 42 is operated to apply the pulsed laser beam LB from the focusing means 422 to the optical device wafer 2, thereby forming a shield tunnel extending between the focal point P and the beam incident surface (back side 2b), the shield tunnel being composed of a fine hole and an amorphous region formed around the fine hole for shielding the fine hole. More specifically, the pulsed laser beam LB having a transmission wavelength to the sapphire substrate constituting the optical device wafer 2 is applied from the focusing means 422 to the wafer 2, and the chuck table 41 is moved in the direction shown by an arrow X1 in FIG. 4A at a predetermined feed speed (shield tunnel forming step). When the other end (right end as viewed in FIG. 4B) of the predetermined division line 22 reaches the position directly below the focusing means 422 as shown in FIG. 4B, the application of the pulsed laser beam LB is stopped and the movement of the chuck table 41 is also stopped.

Figure 4C:
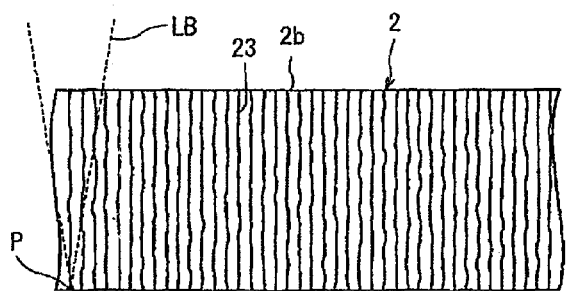
Figure 4D:
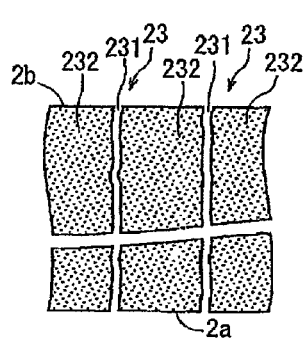
Figure 4E:
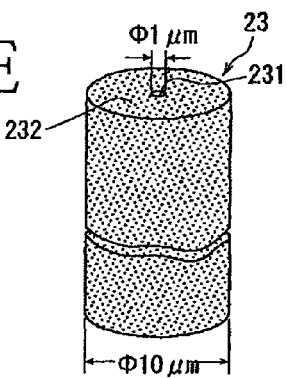

By performing the shield tunnel forming step mentioned above along the predetermined division line 22, a plurality of fine holes 231 and a plurality of amorphous regions 232 are grown from the front side 2a (lower surface) where the focal point P of the pulsed laser beam LB is set to the back side 2b (upper surface) as the beam incident surface as shown in FIGS. 4C and 4D, wherein the amorphous regions 232 are formed around the fine holes 231, respectively. As a result, a plurality of amorphous shield tunnels 23 are formed along the predetermined division line 22 at predetermined intervals, e.g., 10 μm intervals (=(work feed speed: 500 mm/s)/(repetition frequency: 50 kHz)) in this preferred embodiment as shown in FIG. 4C. As shown in FIGS. 4D and 4E, each shield tunnel 23 is composed of the central fine hole 231 having a diameter of about 1 μm and the amorphous region 232 formed around the central fine hole 231 and having a diameter of 10 μm. In this preferred embodiment, the amorphous regions 232 of any adjacent ones of the plural shield tunnels 23 are connected with each other. Each amorphous shield tunnel 23 formed by the shield tunnel forming step mentioned above extends from the front side 2a (lower surface) of the optical device wafer 2 to the back side 2b (upper surface) thereof as the beam incident surface. Accordingly, even when the thickness of the wafer 2 is large, it is sufficient to once apply the pulsed laser beam LB along each division line 22, so that the productivity can be greatly improved. Furthermore, no debris is scattered in the shield tunnel forming step, so that it is possible to solve the problem that the devices may be degraded in quality.

After performing the shield tunnel forming step along the predetermined division line 22 as mentioned above, the chuck table 41 is moved in the indexing direction shown by the arrow Y in FIG. 3 by the pitch of the division lines 22 formed on the optical device wafer 2 (indexing step), and the shield tunnel forming step is similarly performed along the next division line 22 extending in the first direction. In this manner, the shield tunnel forming step is performed along all of the division lines 22 extending in the first direction. Thereafter, the chuck table 41 is rotated 90 degrees to similarly perform the shield tunnel forming step along all of the other division lines 22 extending in the second direction perpendicular to the first direction. To form a good shield tunnel 23 in the shield tunnel forming step, it is important that the value (S) obtained by dividing the numerical aperture (NA) of the focusing lens 422a by the refractive index (N) of the single crystal substrate falls within the range of 0.05 to 0.2 as described above.

Figure 5:
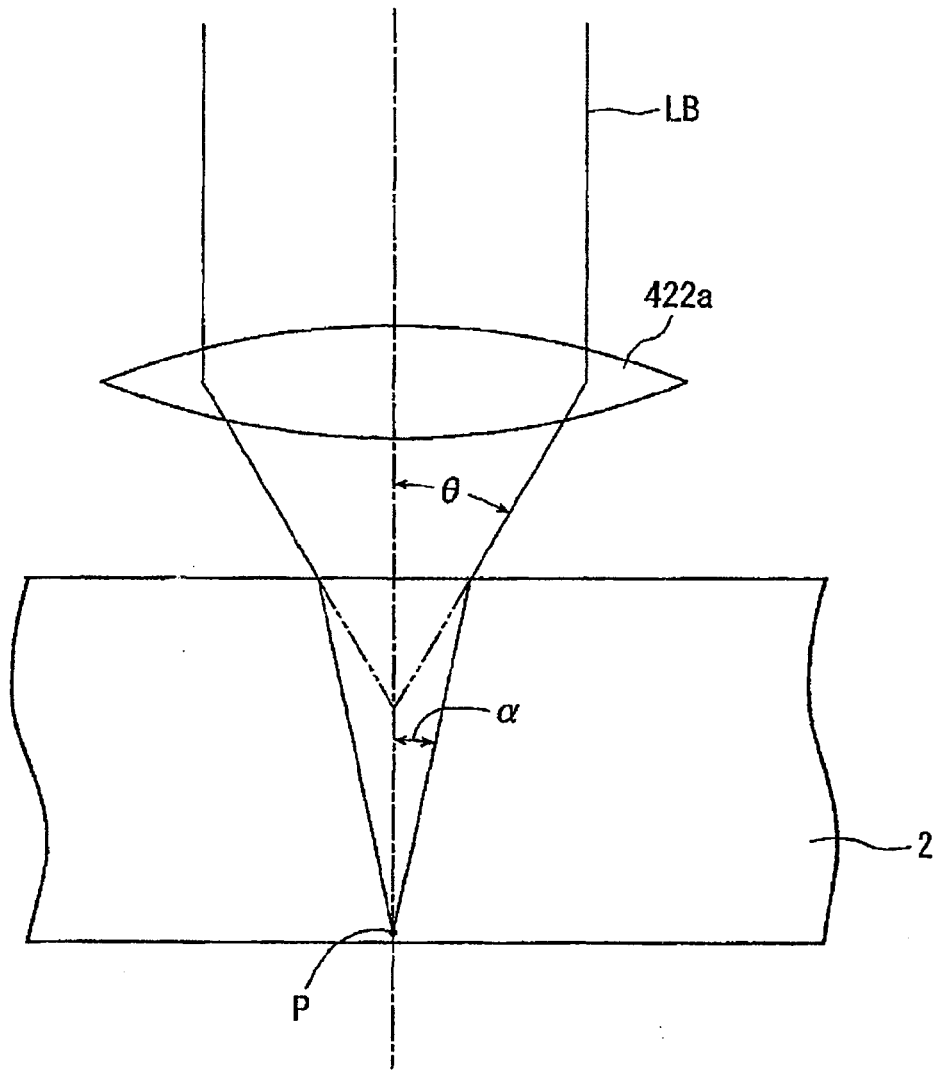
FIG. 5 is a diagram showing the relation between the numerical aperture (NA) of a focusing lens, the refractive index (N) of the optical device wafer, and the value obtained by dividing the numerical aperture (NA) by the refractive index (N)

There will now be described with reference to FIG. 5 the relation between the numerical aperture (NA), the refractive index (N), and the value (S=NA/N) obtained by dividing the numerical aperture (NA) by the refractive index (N). As shown in FIG. 5, the pulsed laser beam LB entering the focusing lens 422a is focused at an angle θ with respect to the optical axis of the focusing lens 422a. In this case, the numerical aperture (NA) of the focusing lens 422a is expressed as sin θ (i.e., NA=sin θ). When the pulsed laser beam LB focused by the focusing lens 422a is applied to the optical device wafer 2 as the single crystal substrate, the pulsed laser beam LB is refracted at an angle α with respect to the optical axis because the density of the single crystal substrate constituting the optical device wafer 2 is higher than that of air, and then focused at the focal point P. This angle α with respect to the optical axis differs according to the refractive index (N) of the single crystal substrate constituting the optical device wafer 2. Since the refractive index (N) is expressed as N=sin θ/sin α, the value (S=NA/N) obtained by dividing the numerical aperture (NA) by the refractive index (N) of the single crystal substrate is given by sin α. Accordingly, it is important that sin α is set in the range of 0.05 to 0.2 (i.e., 0.05≤sin α≤0.2).

There will now be described the reason why the value (S=NA/N) obtained by dividing the numerical aperture (NA) of the focusing lens 422a by the refractive index (N) of the single crystal substrate is set in the range of 0.05 to 0.2.

Example 1-1

By using a sapphire (Al$_2$O$_3$) substrate (refractive index: 1.7) having a thickness of 1000 μm, the shield tunnel forming step was performed under the following processing conditions to form a shield tunnel, and it was determined whether or not the shield tunnel is good.
Processing Conditions
Wavelength: 1030 nm
Repetition frequency: 50 kHz
Pulse width: 10 ps
Average power: 3 W
Focused spot diameter: 10 μm
Work feed speed: 500 mm/s

| Numerical aperture (NA) of the focusing lens | Good/poor condition of the shield tunnel | S = NA/N |
|---|---|---|
| 0.05 | Not formed | |
| 0.1 | Slightly good | 0.058 |
| 0.15 | Good | 0.088 |
| 0.2 | Good | 0.117 |
| 0.25 | Good | 0.147 |
| 0.3 | Good | 0.176 |
| 0.35 | Slightly good | 0.205 |
| 0.4 | Poor | |
| 0.45 | Poor: voids generated | |
| 0.5 | Poor: voids generated | |
| 0.55 | Poor: voids generated | |
| 0.6 | Poor: voids generated | |

It is apparent from the above results that in the case of using a sapphire (Al$_2$O$_3$) substrate (refractive index: 1.7) as the single crystal substrate a substantially good shield tunnel can be formed by setting the numerical aperture (NA) of the focusing lens 422a for focusing the pulsed laser beam so that the value (S=NA/N) obtained by dividing the numerical aperture (NA) by the refractive index (N) of the single crystal substrate falls within the range of 0.05 to 0.2. Accordingly, it is important that the numerical aperture (NA) of the focusing lens 422a for focusing the pulsed laser beam is set in the range of 0.1 to 0.35 in the case of using a sapphire (Al$_2$O$_3$) substrate (refractive index: 1.7) as the single crystal substrate.

Example 1-2

By using a silicon carbide (SiC) substrate (refractive index: 2.63) having a thickness of 1000 μm, the shield tunnel forming step was performed under the following processing conditions to form a shield tunnel, and it was determined whether or not the shield tunnel is good.
Processing Conditions
Wavelength: 1030 nm
Repetition frequency:
Average power: 3 W
Focused spot diameter: 10 μm
Work feed speed: 500 mm/s

| Numerical aperture (NA) of the focusing lens | Good/poor condition of the shield tunnel | S = NA/N |
|---|---|---|
| 0.05 | Not formed | |
| 0.1 | Not formed | |
| 0.15 | Slightly good | 0.057 |
| 0.2 | Good | 0.076 |
| 0.25 | Good | 0.095 |
| 0.3 | Good | 0.114 |
| 0.35 | Good | 0.133 |
| 0.4 | Good | 0.153 |
| 0.45 | Good | 0.171 |
| 0.5 | Good | 0.19 |
| 0.55 | Slightly good | 0.209 |
| 0.6 | Poor: voids generated | |

It is apparent from the above results that in the case of using a silicon carbide (SiC) substrate (refractive index: 2.63) as the single crystal substrate a substantially good shield tunnel can be formed by setting the numerical aperture (NA) of the focusing lens 422a for focusing the pulsed laser beam so that the value (S=NA/N) obtained by dividing the numerical aperture (NA) by the refractive index (N) of the single crystal substrate falls within the range of 0.05 to 0.2. Accordingly, it is important that the numerical aperture (NA) of the focusing lens 422a for focusing the pulsed laser beam is set in the range of 0.15 to 0.55 in the case of using a silicon carbide (SiC) substrate (refractive index: 2.63) as the single crystal substrate.

Example 1-3

By using a gallium nitride (GaN) substrate (refractive index: 2.3) having a thickness of 1000 μm, the shield tunnel forming step was performed under the following processing conditions to form a shield tunnel, and it was determined whether or not the shield tunnel is good.

Processing Conditions
Wavelength: 1030 nm
Repetition frequency: 50 kHz
Pulse width: 10 ps
Average power: 3 W
Focused spot diameter: 10 μm
Work feed speed: 500 mm/s

| Numerical aperture (NA) of the focusing lens | Good/poor condition of the shield tunnel | S = NA/N |
|---|---|---|
| 0.05 | Not formed | |
| 0.1 | Slightly good | 0.043 |
| 0.15 | Good | 0.065 |
| 0.2 | Good | 0.086 |
| 0.25 | Good | 0.108 |
| 0.3 | Good | 0.130 |
| 0.35 | Good | 0.152 |
| 0.4 | Good | 0.173 |
| 0.45 | Good | 0.195 |
| 0.5 | Slightly good | 0.217 |
| 0.55 | Poor: voids generated | |
| 0.6 | Poor: voids generated | |

It is apparent from the above results that in the case of using a gallium nitride (GaN) substrate (refractive index: 2.3) as the single crystal substrate a substantially good shield tunnel can be formed by setting the numerical aperture (NA) of the focusing lens 422a for focusing the pulsed laser beam so that the value (S=NA/N) obtained by dividing the numerical aperture (NA) by the refractive index (N) of the single crystal substrate falls within the range of 0.05 to 0.2. Accordingly, it is important that the numerical aperture (NA) of the focusing lens 422a for focusing the pulsed laser beam is set in the range of 0.1 to 0.5 in the case of using a gallium nitride (GaN) substrate (refractive index: 2.3) as the single crystal substrate.

The shield tunnel is formed so as to extend from the focal point P to the beam incident surface to which the pulsed laser beam is applied. Accordingly, it is necessary to set the focal point P of the pulsed laser beam inside the optical device wafer 2 at a position near the other surface opposite to the beam incident surface.

It was confirmed from Examples 1-1, 1-2, and 1-3 that a substantially good shield tunnel can be formed by setting the numerical aperture (NA) of the focusing lens 422a for focusing the pulsed laser beam so that the value (S=NA/N) obtained by dividing the numerical aperture (NA) by the refractive index (N) of the single crystal substrate falls within the range of 0.05 to 0.2.

There will now be examined the correlation between the energy of the pulsed laser beam and the length of the shield tunnel.

Example 2

The pulsed laser beam was applied to a sapphire ($Al_2O_3$) substrate, silicon carbide (SiC) substrate, and gallium nitride (GaN) substrate each having a thickness of 1000 μm under the following processing conditions to determine the relation between the energy (μJ/pulse) of the pulsed laser beam and the length (μm) of the shield tunnel.

Processing Conditions
Wavelength: 1030 nm
Repetition frequency: 50 kHz
Pulse width: 10 ps
Focused spot diameter: 10 μm
Work feed speed: 500 mm/s The average power of the pulsed laser beam was increased at intervals of 0.05 W (1 μJ/pulse) until the shield tunnel was formed. After the shield tunnel was formed, the average power of the pulsed laser beam was increased at intervals of 0.5 W (10 μJ/pulse) up to 10 W (200 μJ/pulse). Then, the length (μm) of the shield tunnel was measured every time the average power was increased.

| Pulse energy (μJ/pulse) | Length (μm) of the shield tunnel | | |
|---|---|---|---|
| | Sapphire | Silicon carbide | Gallium nitride |
| 1 | Not formed | Not formed | Not formed |
| 2 | Not formed | Not formed | Not formed |
| 3 | Not formed | Not formed | Not formed |
| 4 | Not formed | Not formed | Not formed |
| 5 | 65 | 65 | 70 |
| 10 | 75 | 85 | 85 |
| 20 | 125 | 115 | 125 |
| 30 | 150 | 155 | 170 |
| 40 | 175 | 185 | 205 |
| 50 | 190 | 230 | 250 |
| 60 | 210 | 265 | 295 |
| 70 | 245 | 290 | 330 |
| 80 | 260 | 330 | 365 |
| 90 | 315 | 370 | 415 |
| 100 | 340 | 395 | 450 |
| 110 | 365 | 430 | 485 |
| 120 | 400 | 470 | 530 |
| 130 | 425 | 500 | 565 |
| 140 | 455 | 535 | 610 |
| 150 | 490 | 570 | 650 |
| 160 | 525 | 610 | 685 |
| 170 | 550 | 640 | 735 |
| 180 | 575 | 675 | 770 |
| 190 | 610 | 715 | 815 |
| 200 | 640 | 740 | 850 |

Figure 6:
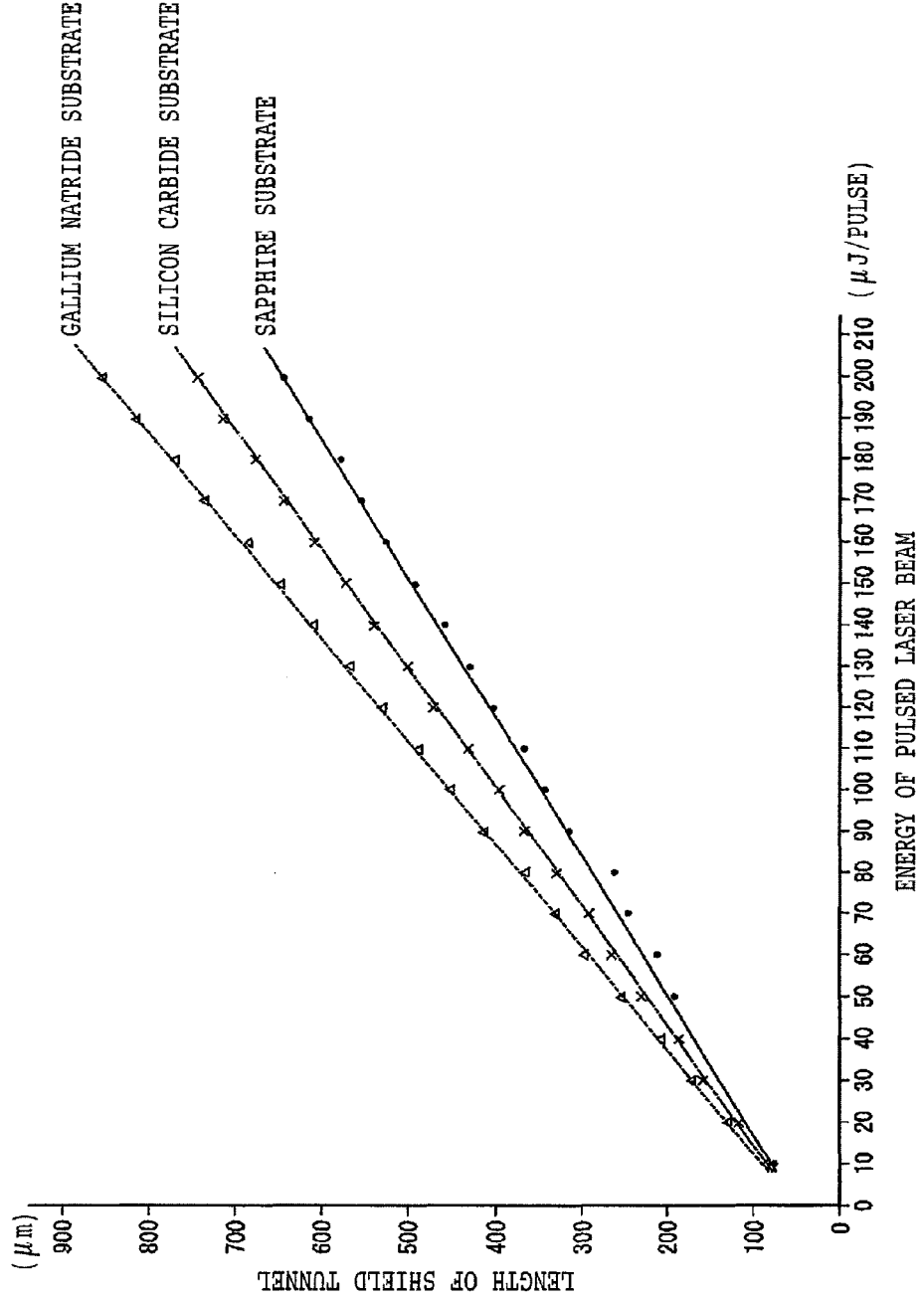
FIG. 6 is a graph showing the relation between the energy of a pulsed laser beam and the length of a shield tunnel in the condition where the shield tunnel is formed in a sapphire ($Al_2O_3$) substrate, silicon carbide (SiC) substrate, and gallium nitride (GaN) substrate.

In the condition where the shield tunnel was formed in the sapphire ($Al_2O_3$) substrate, silicon carbide (SiC) substrate, and gallium nitride (GaN) substrate, the relation between the energy (μJ/pulse) of the pulsed laser beam and the length (μm) of the shield tunnel is shown by the graph in FIG. 6. As apparent from the graph shown in FIG. 6, the minimum value for the energy of the pulsed laser beam to form the shield tunnel is 5 μJ/pulse. Furthermore, letting X and Y denote the energy (μJ/pulse) of the pulsed laser beam and the length (μm) of the shield tunnel, respectively, the correlation between X and Y is expressed as Y=(3.0 to 4.0 μm/μJ)X+50 μm. Accordingly, in the case of using a sapphire ($Al_2O_3$) substrate having a thickness of 500 μm as the single crystal substrate, the energy of the pulsed laser beam is set to 160 μJ/pulse or more, so as to make the length of the shield tunnel equal to the thickness of the single crystal substrate.

There will now be examined the relation between the wavelength of the pulsed laser beam and the formation of the shield tunnel.

Example 3-1

The pulsed laser beam was applied to a sapphire ($Al_2O_3$) substrate having a thickness of 1000 μm under the following processing conditions. In the case of decreasing the wavelength of the pulsed laser beam from 2940 nm through 1550 nm, 1030 nm, 515 nm, 343 nm, and 257 nm to 151 nm, it was determined whether or not the shield tunnel is formed in the sapphire ($Al_2O_3$) substrate with a band gap of 8.0 eV (reduced wavelength: 155 nm).

Processing Conditions
Wavelength: 1030 nm
Repetition frequency: 50 kHz
Pulse width: 10 ps
Average power: 3 W
Focused spot diameter: 10 µm
Work feed speed: 500 mm/s

| Wavelength (nm) | Good/poor condition of the shield tunnel |
|---|---|
| 2940 | Good |
| 1550 | Good |
| 1030 | Good |
| 515 | Good |
| 343 | Good |
| 257 | Poor |
| 151 | Poor ablation on the beam incident surface |

It is apparent from the above results that in the case of using a sapphire ($Al_2O_3$) substrate as the single crystal substrate, a good shield tunnel can be formed by setting the wavelength of the pulsed laser beam to a value two or more times the wavelength (reduced wavelength: 155 nm) corresponding to a band gap of 8.0 eV.

Example 3-2

The pulsed laser beam was applied to a silicon carbide (SiC) substrate having a thickness of 1000 µm under the following processing conditions. In the case of decreasing the wavelength of the pulsed laser beam from 2940 nm through 1550 nm, 1030 nm, and 515 nm to 257 nm, it was determined whether or not the shield tunnel is formed in the silicon carbide (SiC) substrate with a band gap of 2.9 eV (reduced wavelength: 425 nm).
Processing Conditions
Wavelength: 1030 nm
Repetition frequency: 50 kHz
Pulse width: 10 ps
Average power: 3 W
Focused spot diameter: 10 µm
Work feed speed: 500 mm/s

| Wavelength (nm) | Good/poor condition of the shield tunnel |
|---|---|
| 2940 | Good |
| 1550 | Good |
| 1030 | Good |
| 515 | Poor ablation on the beam incident surface |
| 257 | Poor ablation on the beam incident surface |

It is apparent from the above results that in the case of using a silicon carbide (SiC) substrate as the single crystal substrate, a good shield tunnel can be formed by setting the wavelength of the pulsed laser beam to a value two or more times the wavelength (reduced wavelength: 425 nm) corresponding to a band gap of 2.9 eV.

Example 3-3

The pulsed laser beam was applied to a gallium nitride (GaN) substrate having a thickness of 1000 µm under the following processing conditions. In the case of decreasing the wavelength of the pulsed laser beam from 2940 nm through 1550 nm, 1030 nm, and 515 nm to 257 nm, it was determined whether or not the shield tunnel is formed in the gallium nitride (GaN) substrate with a band gap of 3.4 eV (reduced wavelength: 365 nm).
Processing Conditions
Wavelength: 1030 nm
Repetition frequency: 50 kHz
Pulse width: 10 ps
Average power: 3 W
Focused spot diameter: 10 µm
Work feed speed: 500 mm/s

| Wavelength (nm) | Good/poor condition of the shield tunnel |
|---|---|
| 2940 | Good |
| 1550 | Good |
| 1030 | Good |
| 515 | Poor |
| 257 | Poor ablation on the beam incident surface |

It is apparent from the above results that in the case of using a gallium nitride (GaN) substrate as the single crystal substrate, a good shield tunnel can be formed by setting the wavelength of the pulsed laser beam to a value two or more times the wavelength (reduced wavelength: 365 nm) corresponding to a band gap of 3.4 eV.

It was confirmed from Examples 3-1, 3-2, and 3-3 that a good shield tunnel can be formed by setting the wavelength of the pulsed laser beam to a value two or more times the wavelength corresponding to the band gap of the single crystal substrate.

Figure 7:
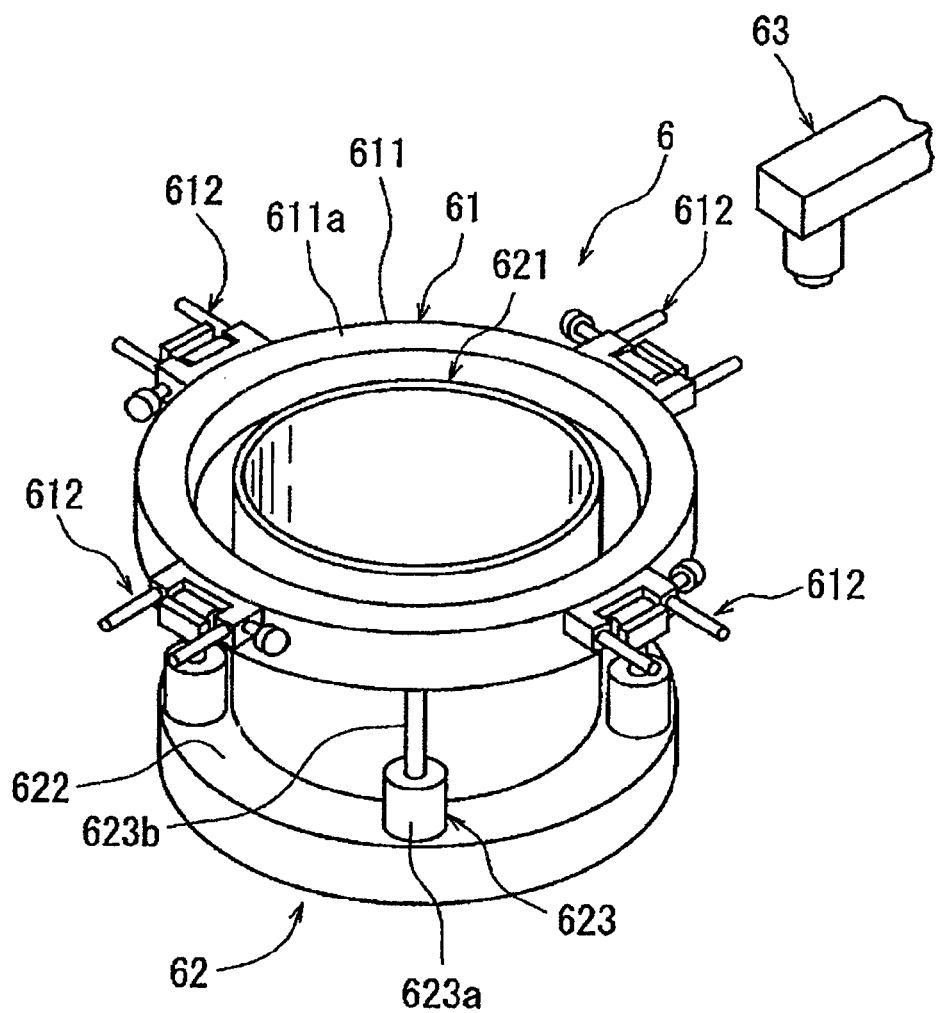
FIG. 7 is a perspective view of a dividing apparatus for dividing the optical device wafer into individual optical devices after performing the shield tunnel forming step.

After performing the shield tunnel forming step mentioned above, a wafer dividing step is performed in such a manner that an external force is applied to the optical device wafer 2 to divide the wafer 2 along each division line 22 where the plural shield tunnels 23 are continuously formed, wherein each shield tunnel is composed of the fine hole 231 and the amorphous region 232 formed around the fine hole 231, thereby obtaining the individual optical devices 21. This wafer dividing step is performed by using a dividing apparatus 6 shown in FIG. 7. The dividing apparatus 6 shown in FIG. 7 includes frame holding means 61 for holding the annular frame 3, tape expanding means 62 for expanding the dicing tape 30 supported to the annular frame 3 held by the frame holding means 61, and a pickup collet 63. The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame 3 thereon. The annular frame 3 mounted on the mounting surface 611a is fixed to the frame holding member 611 by the clamps 612. The frame holding means 61 is supported by the tape expanding means 62 so as to be vertically movable.

Figure 8A:
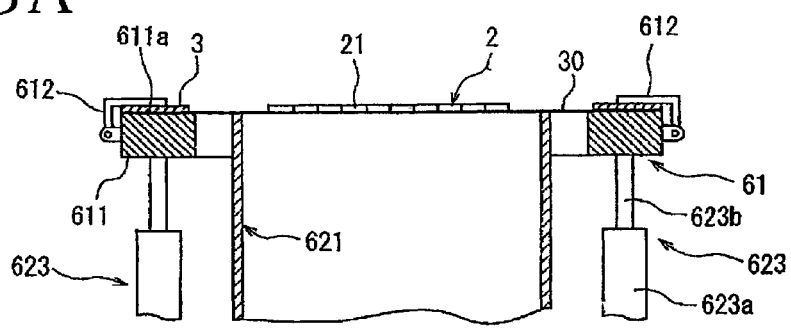
FIGS. 8A to 8C are sectional side views for illustrating a wafer dividing step to be performed by the dividing apparatus shown in FIG. 7.
Figure 8B:
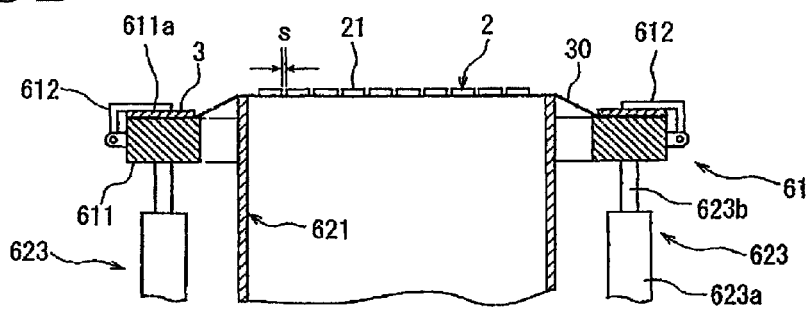

The tape expanding means 62 includes an expanding drum 621 provided inside of the annular frame holding member 611. The expanding drum 621 has an outer diameter smaller than the inner diameter of the annular frame 3 and an inner diameter larger than the outer diameter of the optical device wafer 2 attached to the dicing tape 30 supported to the annular frame 3. The expanding drum 621 has a supporting flange 622 at the lower end of the drum 621. The tape expanding means 62 further includes supporting means 623 for vertically movably supporting the annular frame holding member 611. The supporting means 623 is composed of a plurality of air cylinders 623a provided on the supporting flange 622. Each air cylinder 623a is provided with a piston rod 623b connected to the lower surface of the annular frame holding member 611. The supporting means 623 composed of these plural air cylinders 623a functions to vertically move the annular frame holding member 611 so as to selectively take a reference position where the mounting surface 611a is substantially equal in height to the upper end of the expanding drum 621 as shown in FIG. 8A and an expansion position where the mounting surface 611a is lower in height than the upper end of the expanding drum 621 by a predetermined amount as shown in FIG. 8B.

The wafer dividing step using the dividing apparatus 6 will now be described with reference to FIGS. 8A to 8C. As shown in FIG. 8A, the annular frame 3 supporting the optical device wafer 2 through the dicing tape 30 is mounted on the mounting surface 611a of the frame holding member 611 of the frame holding means 61. Thereafter, the annular frame 3 is fixed to the frame holding member 611 by the clamps 612 (frame holding step). At this time, the frame holding member 611 is set at the reference position shown in FIG. 8A. Thereafter, the air cylinders 623a as the supporting means 623 of the tape expanding means 62 are operated to lower the frame holding member 611 to the expansion position shown in FIG. 8B. Accordingly, the annular frame 3 fixed to the mounting surface 611a of the frame holding member 611 is also lowered, so that the dicing tape 30 supported to the annular frame 3 comes into abutment against the upper end of the expanding drum 621 and is expanded as shown in FIG. 8B (tape expanding step). As a result, a tensile force radially acts on the optical device wafer 2 attached to the dicing tape 30. Accordingly, the optical device wafer 2 is divided into the individual optical devices 21 along each division line 22 where the plural shield tunnels 23 are continuously formed to be reduced in strength. At the same time, a spacing S is formed between any adjacent ones of the individual optical devices 21.

Figure 8C:
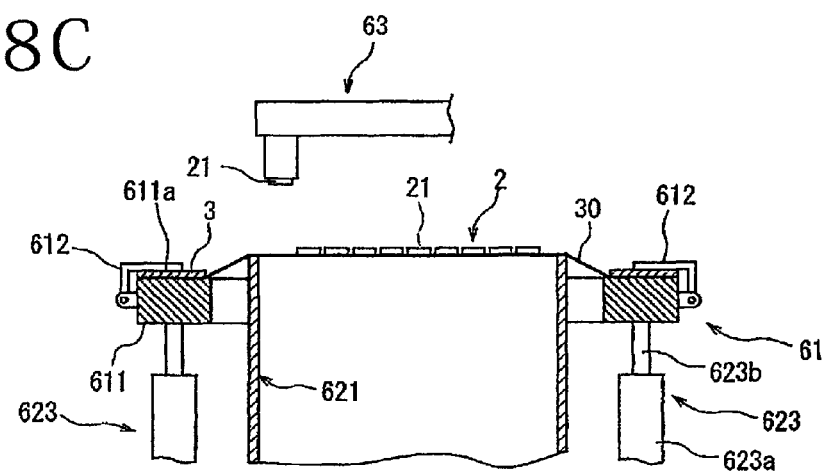

Thereafter, the pickup collet 63 is operated to hold each optical device 21 under suction and peel it from the dicing tape 30, thereby individually picking up the optical devices 21 as shown in FIG. 8C (pickup step). Each optical device 21 is next transferred to a tray (not shown) or any apparatus for performing a die bonding step. In the pickup step, each optical device 21 can be easily picked up without the contact with its adjacent optical device 21 because the spacing S is formed between any adjacent ones of the individual optical devices 21 attached to the dicing tape 30.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method of applying a pulsed laser beam to a single crystal substrate to thereby process the single crystal substrate, the laser processing method comprising:

a numerical aperture setting step of setting a numerical aperture (NA) of a focusing lens for focusing the pulsed laser beam so that a value obtained by dividing the numerical aperture (NA) of the focusing lens by a refractive index (N) of the single crystal substrate falls within the range of 0.05 to 0.2;

a positioning step of relatively positioning the focusing lens and the single crystal substrate in a direction along an optical axis of the focusing lens so that a focal point of the pulsed laser beam is set at a desired position in a direction along the thickness of the single crystal substrate; and a shield tunnel forming step of applying the pulsed laser beam to the single crystal substrate so as to focus the pulsed laser beam at the focal point set in the single crystal substrate by the positioning step, thereby forming a shield tunnel extending between the focal point and a beam incident surface to which the pulsed laser beam is applied, the shield tunnel being composed of a fine hole and an amorphous region formed around the fine hole for shielding the fine hole.

2. The laser processing method according to claim 1, wherein the positioning step includes a step of setting the focal point of the pulsed laser beam inside the single crystal substrate at a position near the other surface opposite to the beam incident surface.

3. The laser processing method according to claim 1, wherein the shield tunnel forming step includes a step of forming a plurality of shield tunnels along a division line set on the single crystal substrate, each shield tunnel being composed of the fine hole and the amorphous region.

4. The laser processing method according to claim 3, wherein the amorphous regions of any adjacent ones of the plural shield tunnels are connected with each other.

5. The laser processing method according to claim 1, wherein the energy of the pulsed laser beam is set so that the length of the shield tunnel is equal to the thickness of the single crystal substrate.

6. The laser processing method according to claim 1, wherein the correlation between the energy of the pulsed laser beam and the length of the shield tunnel is produced and the energy of the pulsed laser beam corresponding to the length of the shield tunnel desired to be formed is set according to the correlation.

7. The laser processing method according to claim 6, wherein the energy of the pulsed laser beam is 5 µJ/pulse or more and the correlation is expressed as Y=(3.0 to 4.0 µm/µJ) X+50 µm, where X and Y denote the energy (µJ/pulse) of the pulsed laser beam and the length (µm) of the shield tunnel, respectively.

8. The laser processing method according to claim 1, wherein the wavelength of the pulsed laser beam is set to a value two or more times the wavelength corresponding to a band gap of the single crystal substrate.

9. The laser processing method according to claim 1, wherein the numerical aperture setting step includes a step of setting the numerical aperture (NA) of the focusing lens to 0.1 to 0.35 in the case that the single crystal substrate is a sapphire ($Al_2O_3$) substrate, setting the numerical aperture (NA) of the focusing lens to 0.15 to 0.55 in the case that the single crystal substrate is a silicon carbide (SiC) substrate, or setting the numerical aperture (NA) of the focusing lens to 0.1 to 0.5 in the case that the single crystal substrate is a gallium nitride (GaN) substrate.

* * * * *